United States Patent
Orchowski

(12) United States Patent Orchowski

(10) Patent No.: US 8,208,235 B2
(45) Date of Patent: Jun. 26, 2012

(54) METHOD OF DETECTING A FAULT CONDITION OF A LOAD CONTROL DEVICE

(75) Inventor: Neil Orchowski, Philadelphia, PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 477 days.

(21) Appl. No.: 12/554,612

(22) Filed: Sep. 4, 2009

(65) Prior Publication Data

US 2011/0058296 A1     Mar. 10, 2011

(51) Int. Cl.
*H02H 3/00* (2006.01)
*H03K 17/56* (2006.01)
(52) U.S. Cl. ............................................ 361/88; 327/425
(58) Field of Classification Search ..................... 361/88; 327/425
See application file for complete search history.

(56) References Cited

U.S. PATENT DOCUMENTS

| | | | | |
|---|---|---|---|---|
| 5,239,255 A | * | 8/1993 | Schanin et al. | 323/237 |
| 5,962,934 A | * | 10/1999 | Fendt et al. | 307/126 |
| 6,081,123 A | * | 6/2000 | Kasbarian et al. | 324/521 |
| 6,646,843 B1 | | 11/2003 | Newman, Jr. et al. | |
| 7,190,124 B2 | | 3/2007 | Kumar et al. | |
| 7,259,524 B2 | | 8/2007 | Hausman, Jr. et al. | |
| 7,432,613 B2 | * | 10/2008 | Jabaji et al. | 307/10.6 |
| 2007/0236152 A1 | | 10/2007 | Davis et al. | |
| 2008/0129218 A1 | * | 6/2008 | Shinmen et al. | 315/280 |
| 2008/0151451 A1 | * | 6/2008 | Kilroy et al. | 361/86 |
| 2008/0278116 A1 | * | 11/2008 | Matsunaga | 320/134 |

* cited by examiner

*Primary Examiner* — Jared Fureman
*Assistant Examiner* — Scott Bauer
(74) *Attorney, Agent, or Firm* — Mark E. Rose; Philip N. Smith; Bridget L. McDonough

(57) ABSTRACT

A load control device comprises a bidirectional semiconductor switch for controlling the amount of power delivered to an electrical load, and the bidirectional semiconductor switch further comprises two field effect transistors (FETs) in anti-series electrical connection. In the event that one of the FETs fails in a shorted state, and if the load control device is using a phase control dimming technique to control the load, the load control device may provide an asymmetric waveform to the electrical load. In order to determine whether this asymmetric waveform is present, a microprocessor of the load control device use voltage thresholds and/or offsets to monitor the voltage across the FETs. Thus, the microprocessor is operable to detect a fault condition of the load control device wherein the fault condition may comprise an asymmetry condition, or more particularly, a failure condition of one of the FETs.

32 Claims, 12 Drawing Sheets

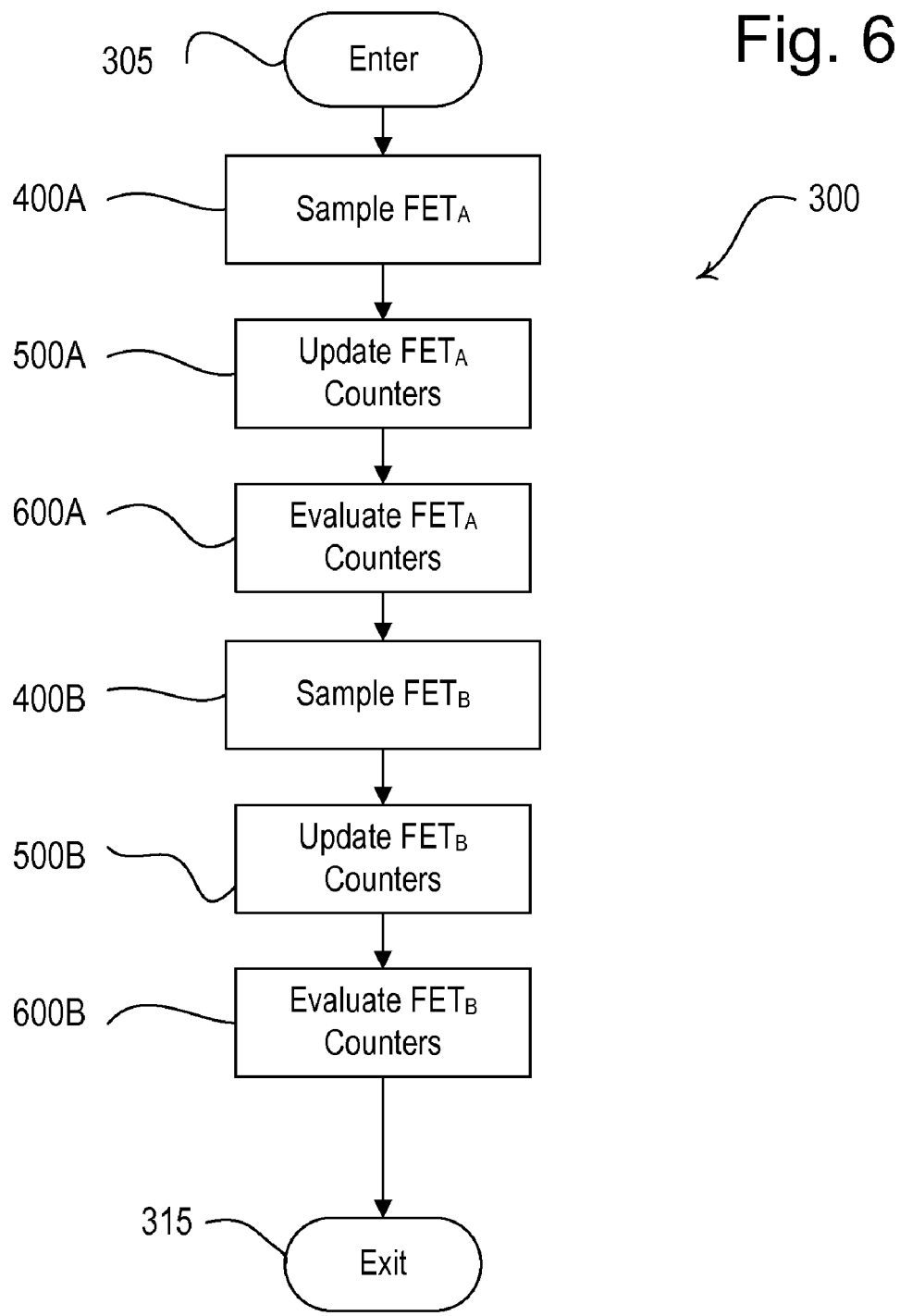

METHOD OF DETECTING A FAULT CONDITION OF A LOAD CONTROL DEVICE

BACKGROUND OF THE INVENTION

1. Field of the Invention

The present invention relates to a load control device comprising a bidirectional semiconductor switch for controlling the amount of power delivered to an electrical load, and more specifically, to a method of detecting a fault condition of the load control device, in particular, a failure condition of the bidirectional semiconductor switch.

2. Description of the Related Art

Bidirectional semiconductor switches are typically used in various load control devices to control the amount of power provided from an alternating current (AC) power source to a load, such as a lighting load. A bidirectional semiconductor switch may comprise one semiconductor switch such as a field effect transistor (FET) within a full-wave rectifying bridge or a triac; or two semiconductor switches, such as two FETs or two insulated gate bipolar transistors (IGBTs), coupled in anti-series electrical connection, or two silicon-controlled rectifiers (SCRs) coupled in anti-parallel electrical connection.

The load control device may be operable to either switch (i.e., turn on and off) or dim (i.e., adjust the intensity of) the controlled load. In order to dim a lighting load, the load control device may employ a phase control dimming technique such that the bidirectional semiconductor switch is rendered conductive for a portion of a given half cycle of the AC power source and non-conductive for the remaining portion of the given half cycle, thereby providing only a portion of the AC power source to the load. For example, the load control device may comprise two FETs coupled in anti-series connection, such that each FET can be independently rendered conductive and non-conductive to provide the appropriate amount of power to the load (i.e., the first FET is rendered conductive during the positive half cycle of the AC power source and the second FET is rendered conductive during the negative half cycle). Additionally, when a load control device employs the phase control dimming technique, the load control device will typically control the bidirectional semiconductor switch to be conductive for the same amount of time in the positive half cycle and in the negative half cycle so as to provide a symmetric AC voltage waveform to the load.

Semiconductor switches, like many electrical components and devices, can be subject to failures. The failure of the semiconductor switch may be the result of an exposure to over-voltage, over-current, and/or over-temperature conditions, or simply the expiration of a rated lifetime of the semiconductor switches. One type of electrical failure (or fault condition) is defined as a semiconductor switch failing in a shorted state (i.e., fully conductive state).

If the load control device is using a phase control dimming technique to control two anti-series coupled semiconductor switches, and one of the semiconductor switches has failed in the shorted state, it is possible that the load control device will provide an asymmetric AC voltage waveform to the load. For example, the asymmetric AC voltage may be caused when one of the semiconductor switches is rendered non-conductive during a portion of a positive half cycle but the other semiconductor switch is fully conductive during the entire negative half cycle as a result of failing in the shorted state. The asymmetric AC voltage provided to the load results in a direct-current (DC) offset that may create undesirable conditions for certain load types. For example, the asymmetric AC voltage can cause a magnetic low voltage load having a transformer to saturate, overheat, and potentially damage the transformer and/or the load control device.

Thus, it is advantageous for a load control device to be able to detect an asymmetric voltage condition across the load, and more particularly, to detect when one or more of the semiconductor switches of the bidirectional semiconductor switch has failed in a shorted state. Upon detecting the failure, the load control device may initiate a protection mode, such as, for example, driving the other (properly-functioning) semiconductor switch to a fully conductive state as well. When one of the semiconductor switches is electrically shorted and the other semiconductor switch is controlled to be fully conductive, the resulting full AC waveform provided by the load control device to the load is symmetrical, and there is no DC offset. Thus, the protection mode can mitigate potential damage to certain load types and/or to the load control device itself.

However, the failure detection methods of prior art load control devices would sometimes result in false detections of failure conditions. For example, certain load conditions would be incorrectly detected as an indication of a failed semiconductor switch, and thus, the load control device would initiate the protection mode unnecessarily and provide the full AC waveform to the load. In other words, the load control device would no longer dim the intensity of the lighting load while operating in the protection mode.

Therefore, there is a need for a more reliable and improved method of detecting a fault condition of a load control device wherein the fault condition may comprise an asymmetry condition, or more particularly, a failure condition of a semiconductor switch.

SUMMARY OF THE INVENTION

According to an embodiment of the present invention, a method of detecting a fault condition of a first semiconductor switch in a load control device operable to be electrically coupled between an alternating-current (AC) power source and a load for control of the load to an on state or an off state, the first semiconductor switch coupled in anti-series connection with a second semiconductor switch, the method comprising the steps of: measuring a first voltage across the first semiconductor switch during a first half cycle of the AC power source; comparing the first measured voltage to a first voltage threshold and a second voltage threshold greater than the first voltage threshold; measuring a second voltage across the second semiconductor switch during a second half cycle of the AC power source; comparing the second measured voltage to the first and second voltage thresholds; and detecting the fault condition of the first semiconductor switch if the first measured voltage is less than the first voltage threshold and the second measured voltage is greater than the second voltage threshold.

In addition, a method of detecting an asymmetry condition in a bidirectional semiconductor switch of a load control device, the load control device operable to be electrically coupled between an alternating-current (AC) power source and a load, the bidirectional semiconductor switch comprising first and second semiconductor switches coupled in anti-series connection, the method comprising the steps of: measuring a first voltage across the first semiconductor switch during a first half cycle of the AC power source; measuring a second voltage across the second semiconductor switch during a second half cycle of the AC power source; and detecting the asymmetry condition in the bidirectional semiconductor switch if a difference between the first and second measured voltages is greater than a predetermined offset threshold.

In addition, a method of detecting a fault condition in a load control device operable to be electrically coupled between an alternating current (AC) power source and a load, the method comprising the steps of: rendering a first semiconductor switch non-conductive for a first predetermined period of time during a first line cycle of the AC power source; measuring a first voltage across the first semiconductor switch during the first line cycle; comparing the first measured voltage to a first predetermined voltage threshold; if the first measured voltage is less than the first predetermined voltage threshold, rendering the first semiconductor switch non-conductive for a second period time, greater than the first period of time, during a second line cycle of the AC power source; measuring a second voltage across the first semiconductor switch during the second line cycle; comparing the second measured voltage to the first predetermined voltage threshold; and detecting the fault condition of the first semiconductor switch if the second measured voltage is less than the first predetermined voltage threshold.

Other features and advantages of the present invention will become apparent from the following description of the invention that refers to the accompanying drawings.

BRIEF DESCRIPTION OF THE DRAWINGS

FIG. 6 is a simplified flowchart of a fault detection procedure according to the present invention.

DETAILED DESCRIPTION OF THE INVENTION

Figure 1:
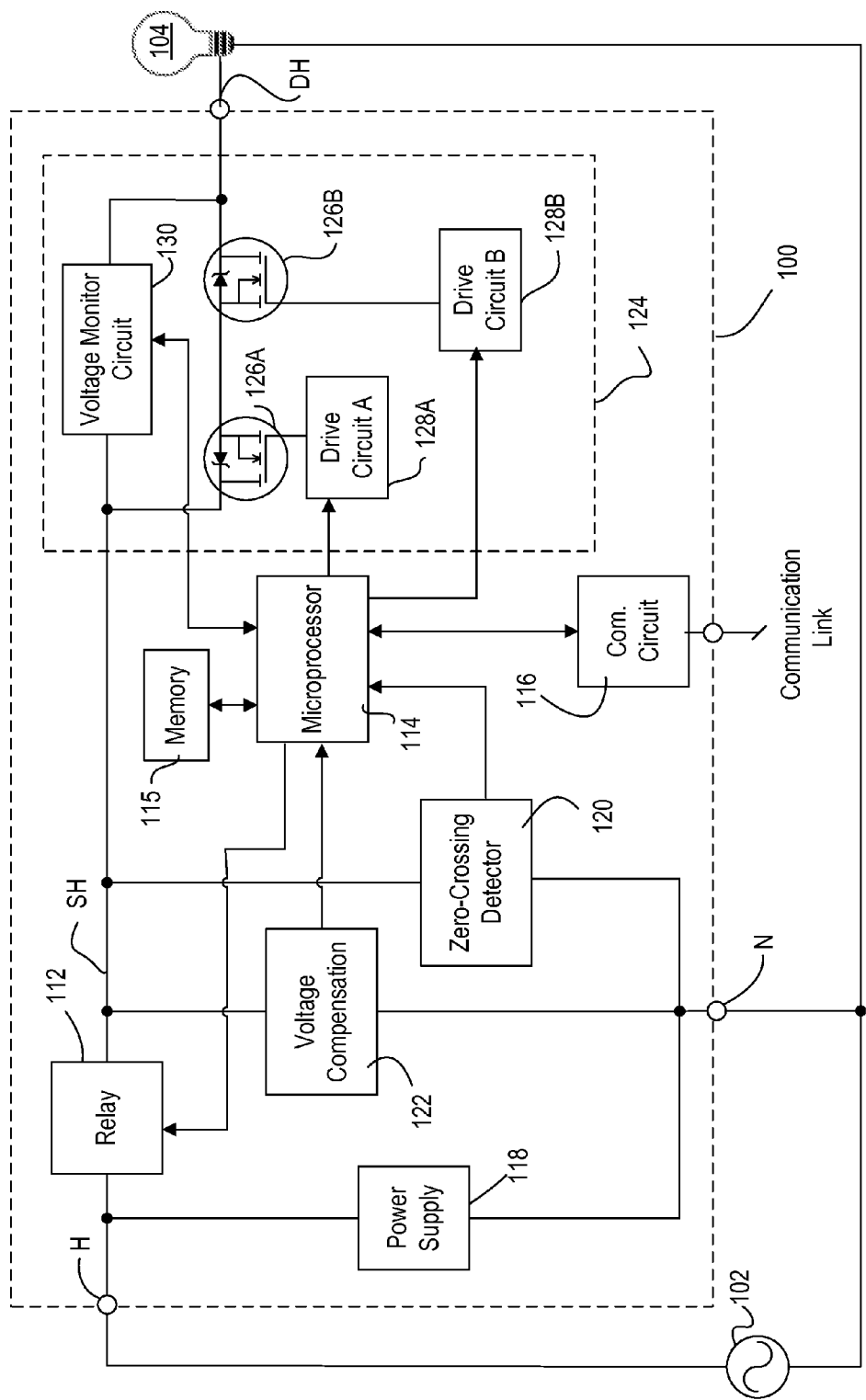
FIG. 1 is a simplified block diagram of a load control device according to a first embodiment of the present invention.

The foregoing summary, as well as the following detailed description of the preferred embodiments, is better understood when read in conjunction with the appended drawings. For the purposes of illustrating the invention, there is shown in the drawings an embodiment that is presently preferred, in which like numerals represent similar parts throughout the several views of the drawings, it being understood, however, that the invention is not limited to the specific methods and instrumentalities disclosed.

FIG. 1 is a simplified block diagram of a load control device 100 electrically coupled between a hot reference of an alternating current (AC) power source 102 (e.g., 120 V, 60 Hz) via a hot terminal (H) and a lighting load 104 via a dimmed hot terminal (DH). The lighting load 104 is coupled between the DH terminal and a neutral reference of the AC power source 102 and may comprise, for example, an incandescent lighting load, a low voltage lighting load including a magnetic low voltage transformer or an electronic low voltage transformer, a fluorescent light source, an LED light source, or any other suitable type of lighting load. Alternatively, the load 104 may comprise a motor load, such as a fan or a motorized window treatment. The load control device 100 further comprises a neutral terminal (N) which is also coupled to the neutral reference of the AC power source 102.

The load control device 100 comprises an airgap switch, i.e., a relay 112, which is coupled to the hot terminal H and provides a switched hot voltage (SH) to a load control circuit 124. The load control circuit 124 is coupled to the dimmed hot terminal and is operable to control the amount of power provided to, and thus, the intensity of, the lighting load 104. Both the relay 112 and the load control circuit 124 are controlled by a microprocessor 114. The microprocessor 114 may alternatively be any suitable controller, such as a programmable logic device (PLD), a microcontroller, or an application specific integrated circuit (ASIC). The microprocessor 114 is coupled to a non-volatile memory 115 for storage of data regarding the operation of the load control device 100.

The microprocessor 114 is operable to send and receive digital control signals via a communication circuit 116 which is coupled to a communication link. The communication link may comprise a low voltage wired link, or a wireless link such as a radio frequency (RF) or an infrared (IR) communication link. For example, a plurality of remote control devices (not shown) may be coupled to the communication link, and each remote control device may be operable to send a digital control signal to the load control device 100 to provide for control of the lighting load 104. A power supply 118 is coupled between the hot terminal H and the neutral terminal N, and generates a direct-current (DC) voltage $V_{CC}$ (not shown) for powering the microprocessor 114, the communication circuit 116, and other low-voltage circuitry of the load control device 100.

The load control circuit 124 comprises a bidirectional semiconductor switch including two field effect-transistors (FETs) 126A, 126B coupled in anti-series electrical connection, to control the amount of power delivered to the lighting load 104. Alternatively, the bidirectional semiconductor switch could comprise a single triac, two insulated gate bipolar transistors (IGBTs) coupled in anti-series electrical connection, or two silicon controlled-rectifiers (SCRs) coupled in anti-parallel electrical connection. Each FET 126A, 126B is coupled to a respective drive circuit 128A, 128B, which provides a gate voltage to each FET in order to render each FET conductive. Each FET 126A, 126B is controlled individually during each half cycle of the AC power source 102. Using the phase control dimming technique, the microprocessor 114 controls the drive circuits 128A, 128B to render the FETs 126A, 126B conductive for a portion of each half cycle to provide power to the lighting load 104 and non-conductive for the other portion of the half cycle to disconnect power from the load 104.

For example, during the positive half cycle, the drive circuit 128A provides an active (high) gate voltage to FET 126A in order to render the FET conductive during a portion of the positive half cycle, and removes the active gate voltage to FET 126A in order to render the FET non-conductive during the remaining portion of the positive the half cycle. During the negative half cycle, the drive circuit 128B provides the active (high) gate voltage to FET 126B in order to render the FET 126B conductive during a portion of the negative half cycle, and removes the active gate voltage to FET 126B in order to render the FET non-conductive during the remaining portion of the negative the half cycle. Ideally, each FET 126A, 126B is conductive for the same amount of time within a full line cycle (i.e., the conduction time of FET 126A is equal to the conduction time of FET 126B for a given line cycle) in order to provide a symmetric voltage waveform to the lighting load 104.

In reverse-phase control dimming, the FETs 126A, 126B are conductive at the beginning of each half cycle. In addition, during reverse phase control, the drive circuit 128A may begin to provide the active (high) gate voltage to FET 126A during a portion of the negative half cycle such that when the AC line voltage transitions from negative to positive polarity, FET 126A will be immediately rendered conductive during the positive half cycle as the drive circuit 128A provides the active high gate voltage. Likewise, the drive circuit 128B may begin to provide the active (high) gate voltage to FET 126B during a portion of the positive half cycle such that when the line voltage transitions from positive to negative polarity, FET 126B will be immediately rendered conductive at the very beginning of the negative half cycle until the drive circuit 128B removes the active gate voltage.

Alternatively, in forward-phase control dimming, the FETs 126A, 126B are conductive at the end of each half cycle. Thus, during forward phase control, the drive circuit 128A will begin to provide the active (high) gate voltage to FET 126A during a portion of the positive half cycle and may not remove the active high gate voltage until some point during the negative half cycle to ensure that FET 126A remains conductive up until the current flowing through the FET transitions from positive to negative polarity. Likewise, the drive circuit 128B will begin to provide the active (high) gate voltage to FET 126B during a portion of the negative half cycle and may not remove the active high gate voltage until some point during the positive half cycle to ensure that FET 126B remains conductive up until the current flowing through the FET transitions from negative to positive polarity.

The load control circuit 124 also includes a voltage monitor circuit 130, which is coupled across the FETs 126A, 126B, and may comprise a full-wave op-amp rectifying circuit. The voltage monitor circuit 130 detects the voltage across the FETs 126A, 126B and provides an output signal representative of this detected voltage to the microprocessor 114. This signal is used by the microprocessor 114 to detect a failure condition of the FETs 126A, 126B as will be discussed in greater detail below.

A zero-crossing detector 120 determines the zero-crossings of the line voltage of the AC power source 102. A zero-crossing is defined as the time at which the line voltage transitions from positive to negative polarity, or from negative to positive polarity, at the beginning of each half-cycle. The zero-crossing information is provided as an input to the microprocessor 114. The microprocessor 114 controls the FETs 126A, 126B of the load control circuit 124 to provide line voltage to the lighting load 104 at predetermined times relative to the zero-crossing points of the AC waveform using the standard phase control dimming techniques.

The zero-crossing detector 120 includes an active filter for receiving the line voltage from the AC power source 102 to filter any noise produced by other electrical devices and for recovering the AC fundamental waveform. The recovered AC fundamental is preferably substantially free of noise or distortion, and of frequency components greater than at least second order harmonics, that may be present on the line voltage of the AC power source 102, and that might otherwise result in faulty or incorrect zero crossing detection. The filter may take an analog or digital (software) form and is described in greater detail in commonly-assigned U.S. Pat. No. 6,091,205, issued Jul. 18, 2000, and commonly-assigned U.S. Pat. No. 6,380,692, issued Apr. 30, 2002, both entitled PHASE CONTROLLED DIMMING SYSTEM WITH ACTIVE FILTER FOR PREVENTING FLICKERING AND UNDESIRED INTENSITY CHANGES. The entire disclosures of both patents are hereby incorporated by reference.

The load control device 100 includes a voltage compensation circuit 122. The voltage compensation circuit 122 integrates a signal representative of a square of an amplitude of the electrical AC waveform to produce a signal representative of the energy delivered to the lighting load 104 in a given half-cycle, and provides that signal to the microprocessor 114. For example, if reverse-phase control dimming is being used, the microprocessor 114 may use the signal generated by the voltage compensation circuit 122 to control the load control circuit 124 in response to the energy delivered to the lighting load 104. The voltage compensation circuit 122 is described in greater detail in commonly-assigned co-pending U.S. patent application Ser. No. 10/865,083, filed Jun. 10, 2004, entitled APPARATUS AND METHODS FOR REGULATING DELIVERY OF ELECTRICAL ENERGY, the entire disclosure of which is hereby incorporated by reference.

Figure 2A:
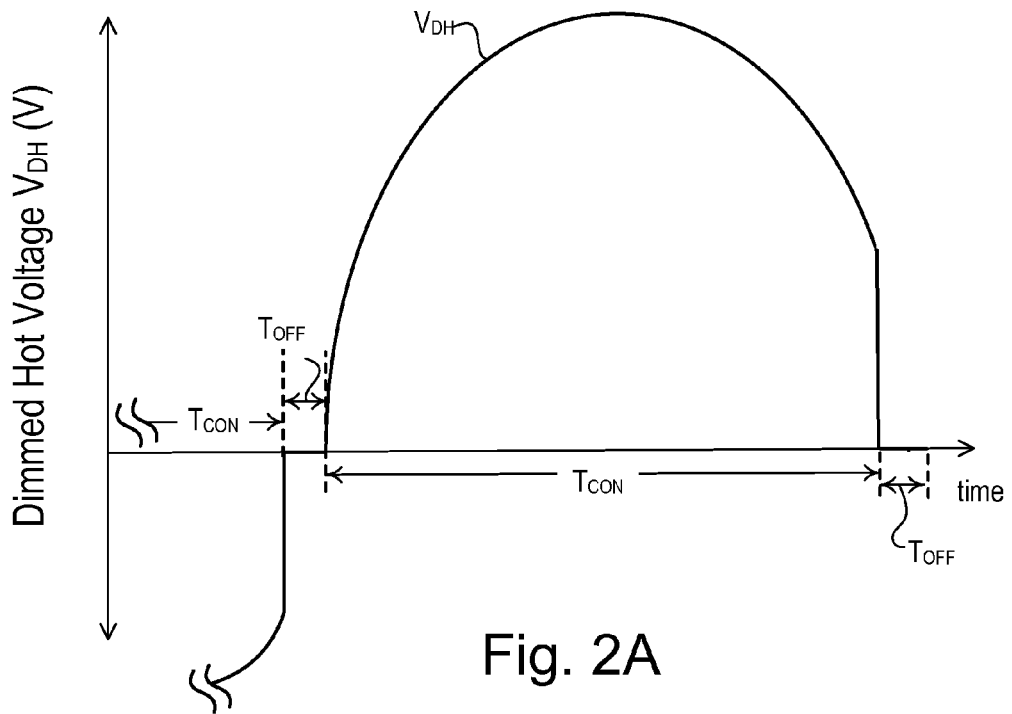
FIG. 2A and FIG. 2B are example voltage waveforms illustrating reverse-phase control dimming during a normal operation condition.
Figure 2B:
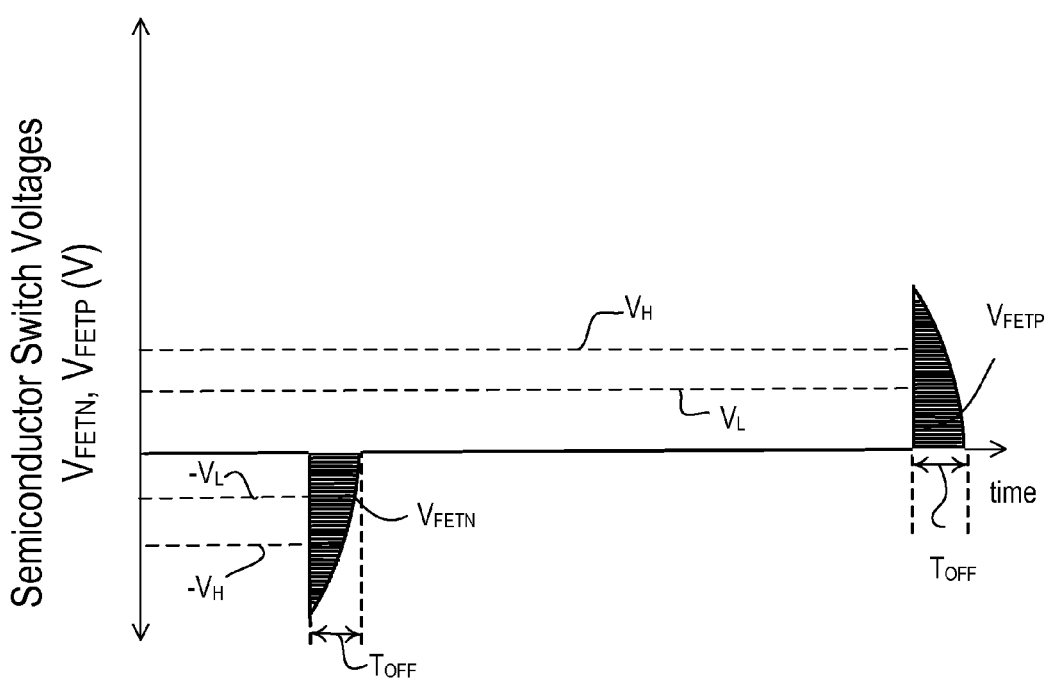

FIG. 2A and FIG. 2B show example voltage waveforms illustrating reverse-phase control dimming provided by the load control device 100 during a normal operating condition when the load control device is controlling the lighting load 104 to an on state near a maximum light intensity level. In this example, the lighting load 104 is mostly resistive which is characteristic of an incandescent lighting load. As mentioned above, during reverse-phase control dimming, the FETs 126A, 126B are rendered conductive at the beginning of each half cycle during a conduction time $T_{CON}$, and are rendered non-conductive at the end of each half cycle during an off time $T_{OFF}$. During the conduction time $T_{CON}$, the AC line voltage is provided to the lighting load 104 via a dimmed hot voltage $V_{DH}$ as shown in FIG. 2A. During the off time $T_{OFF}$, the remaining voltage provided by the AC power source is present across the FETs 126A, 126B as indicated by the shaded regions of FIG. 2B. In particular, during the positive and negative half cycles, the voltage across the FETs is indicated as $V_{FETP}$ and $V_{FETN}$ representing the voltage across FETs 126A, 126B, respectively.

The voltage monitor circuit 130 of the load control device 100 monitors the voltages $V_{FETN}$, $V_{FETP}$ and provides a rectified, scaled voltage signal representative of those voltages to the microprocessor 114. According to one aspect of the present invention, the microprocessor 114 can compare the detected voltages to two different threshold voltages, a high threshold voltage $V_H$ (e.g., 12 V) and a low threshold voltage $V_L$ (e.g., 7.5 V) as shown in FIG. 2B. The high and low threshold voltages differ by an offset voltage threshold (e.g., 4.5 V). (FIG. 2B also shows the negative threshold voltages $-V_H$ and $-V_L$ for illustrative purposes. Since the microprocessor 114 receives rectified voltage signals from the voltage monitoring circuit 130, it operates using positive voltages only.) In this normal operating condition of the on state, both voltages $V_{FETN}$ and $V_{FETP}$ exceed the high threshold voltage $V_H$, and the microprocessor 114 determines that both FETs 126A, 126B are operating properly as they are both operable to be rendered non-conductive during the off time.

When the load control device 100 is controlling the load 104 to the off state, the FETs 126A, 126B are both rendered non-conductive across multiple line cycles, thus no voltage from the AC power source is provided to the load (i.e., $V_{DH}$ is approximately zero). Because no AC voltage is provided to the load, there is a greater amount of voltage present across each FET during each half cycle. As a result, the high and low threshold voltages $V_H$ and $V_L$ can have greater magnitudes during the off state as opposed to the on state. (Increasing the magnitudes of the thresholds results in an improved signal-to-noise ratio of the voltages measured across the semiconductor switches.) For example, during the off state, the magnitude of the high threshold voltage $V_H$ may be approximately 47 V, and the magnitude of the low threshold voltage $V_L$ may be approximately 20 V.

Figure 3A:
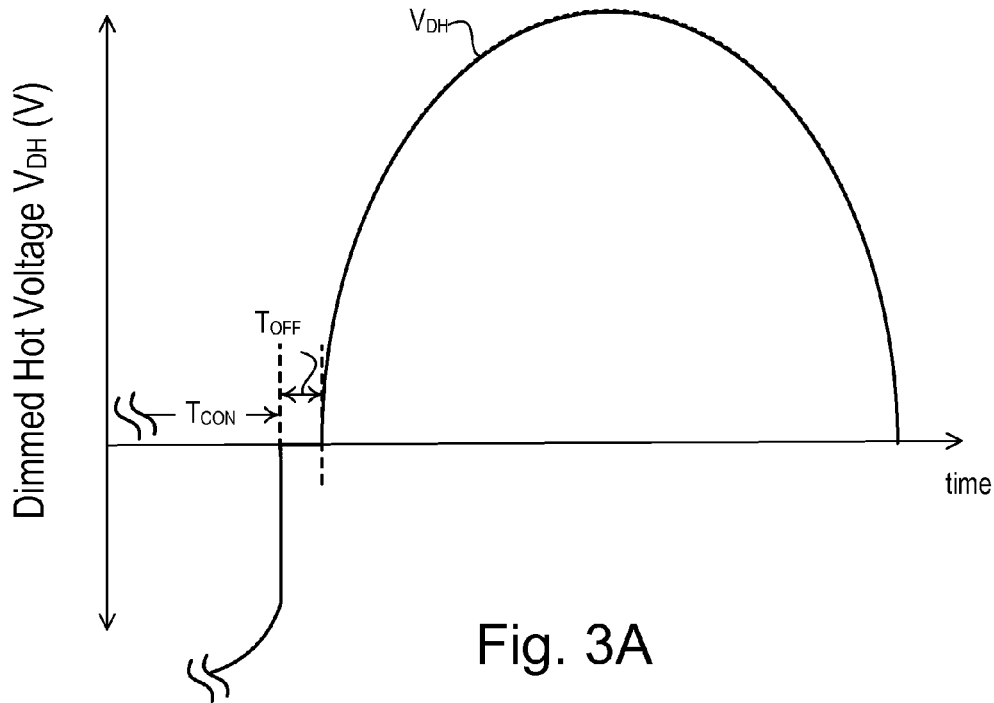
FIG. 3A and FIG. 3B are example voltage waveforms illustrating reverse-phase control dimming during a failure condition.
Figure 3B:
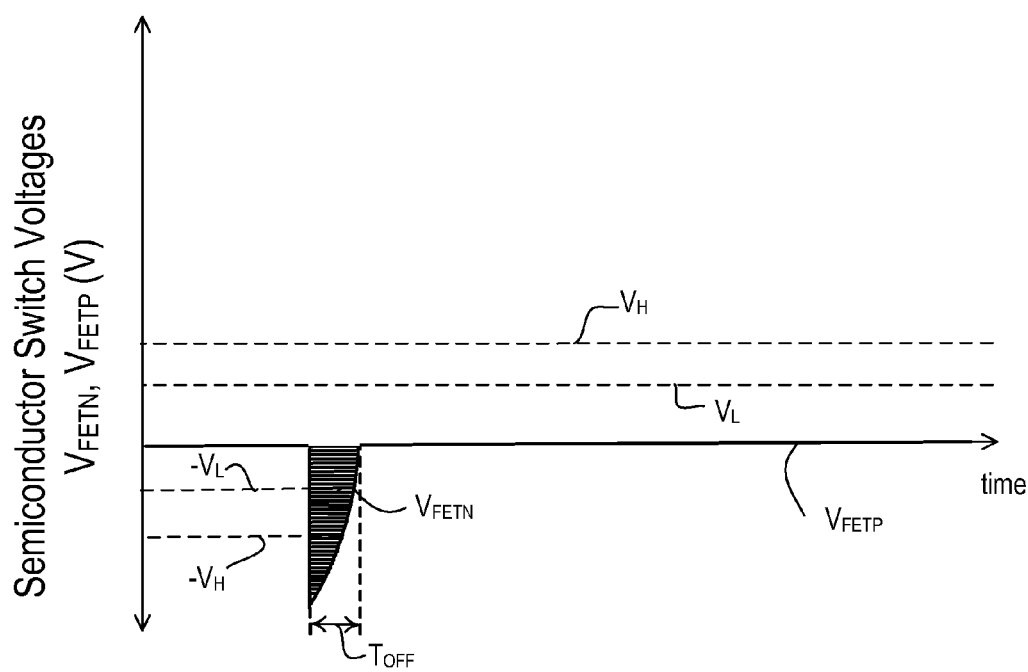

FIG. 3A and FIG. 3B show example voltage waveforms illustrating reverse-phase control dimming provided by the load control device 100 during a failure condition in the on state. More particularly, the failure condition is defined as at least one of the FETs failing in a shorted (i.e., fully conductive) state. During the negative half cycle, the first FET 126B is operating properly as it is conductive and non-conductive during times $T_{CON}$ and $T_{OFF}$ respectively, and the voltage $V_{FETN}$ is present across FET 126B during time $T_{OFF}$ as shown in FIG. 3B. However, during the positive half cycle, the second FET 126A cannot be rendered non-conductive because it has failed in a shorted state. Thus, during the positive half cycle, all of the line voltage from the AC voltage source is provided to the lighting load 104 (as indicated as the dimmed hot voltage $V_{DH}$ in FIG. 3A) and no voltage is present across FET 126A during the failure condition, thus, the voltage $V_{FETP}$ is approximately zero.

During this failure condition, the microprocessor 114 compares the peak magnitudes of the voltages $V_{FETN}$, $V_{FETP}$ as provided by the voltage monitor circuit 130 to the values of the threshold voltages $V_H$ and $V_L$. Because the voltage (i.e., $V_{FETN}$) across the first FET 126B exceeds the high threshold voltage $V_H$, and the other voltage (i.e., $V_{FETP}$) does not exceed the low threshold $V_L$, the microprocessor 114 determines that there is an asymmetry condition, and more particularly, that FET 126A may have failed in a shorted state. In other words, the microprocessor 114 determines that one of the FETs may have failed in a shorted state if the voltage $V_{FETP}$ is less than the low threshold voltage $V_L$ and the difference between the peak magnitudes of the voltages $V_{FETP}$ and $V_{FETN}$ exceeds the offset threshold.

Figure 4A:
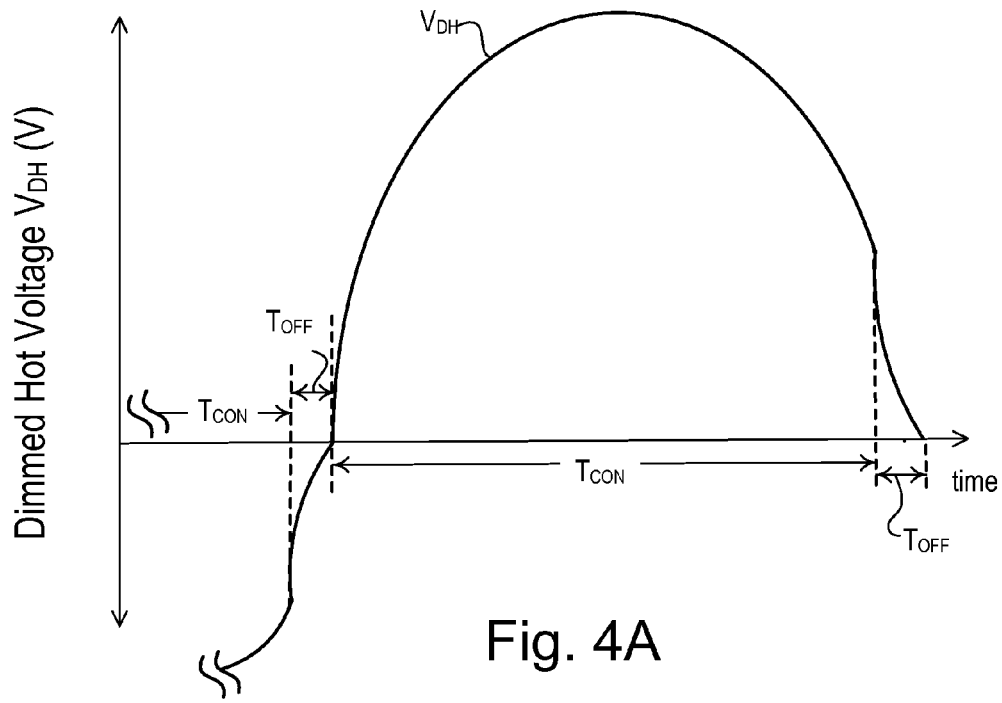
FIG. 4A and FIG. 4B are example voltage waveforms illustrating reverse-phase control dimming on a capacitive load during a normal operation condition.
Figure 4B:
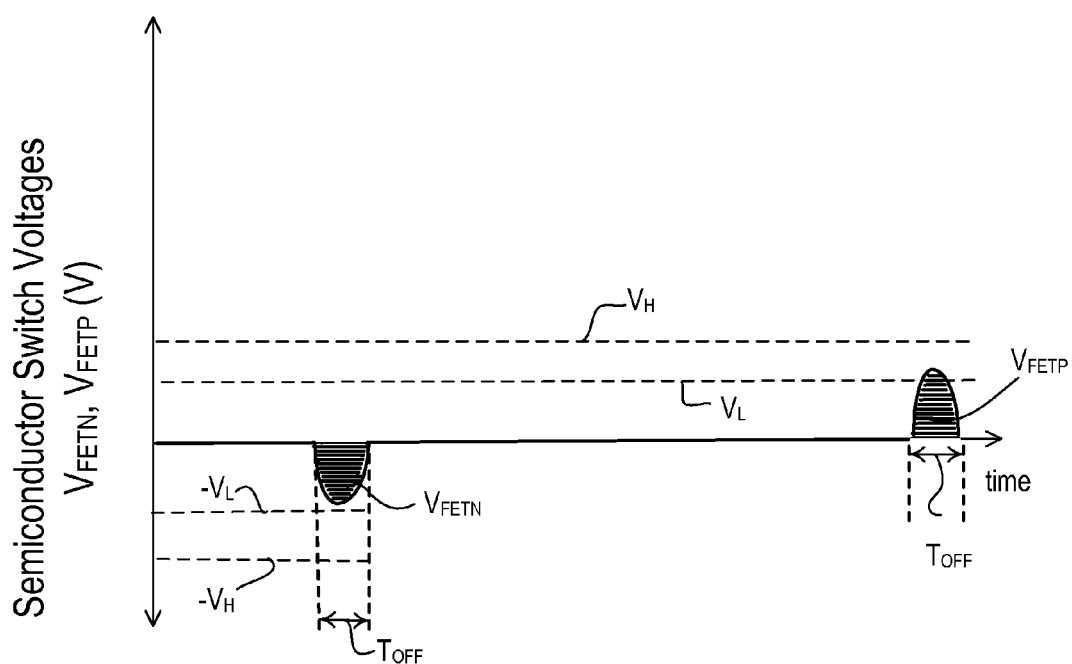

FIGS. 4A and 4B show example voltage waveforms illustrating reverse-phase control dimming provided by the load control device 100 during a normal operating condition when controlling the load 104 to an on state near a maximum light intensity level. In this example, the lighting load 104 is highly capacitive, which is a typical operating characteristic of electronic low voltage transformers. As shown in FIG. 4A, when the FETs 126A, 126B are rendered non-conductive during the off times $T_{OFF}$, the dimmed hot voltage $V_{DH}$ does not immediately transition to zero volts as compared with the voltage waveform of FIG. 2A. Rather, due to the capacitive nature of the lighting load 104, the dimmed hot voltage $V_{DH}$ decays more gradually during the off time $T_{OFF}$. As a result of this gradual decay, the voltages across the FETs 126A, 126B increases more slowly during the off times $T_{OFF}$ as shown in FIG. 4B.

In this example, the negative voltage $V_{FETN}$ across FET 126B and the positive voltage $V_{FETP}$ across FET 126A are near the low threshold voltage $V_L$. In particular, the negative voltage $V_{FETN}$ is slightly below the low threshold voltage $V_L$, and the positive voltage $V_{FETP}$ is slightly above the low threshold voltage $V_L$. If the microprocessor 114 were only using the low threshold voltage $V_L$ as the criteria for detecting a shorted FET (as taught by the prior art), then the microprocessor would incorrectly determine that FET 126B was shorted at this point in time. However, according to an embodiment of the present invention, the microprocessor 114 must detect that the voltage of the first FET is below the low threshold voltage $V_L$ and that the voltage across the second FET is above the high threshold voltage $V_H$ in order to determine that there is an asymmetry condition or that the first FET has shorted. Because the voltage $V_{FETP}$ across FET 126A is less than the high threshold voltage $V_H$, the microprocessor 114 will correctly determine that both FETs 126A, 126B are operating properly while using the reverse-phase control dimming technique despite the capacitive characteristic of the lighting load 104.

Figure 5A:
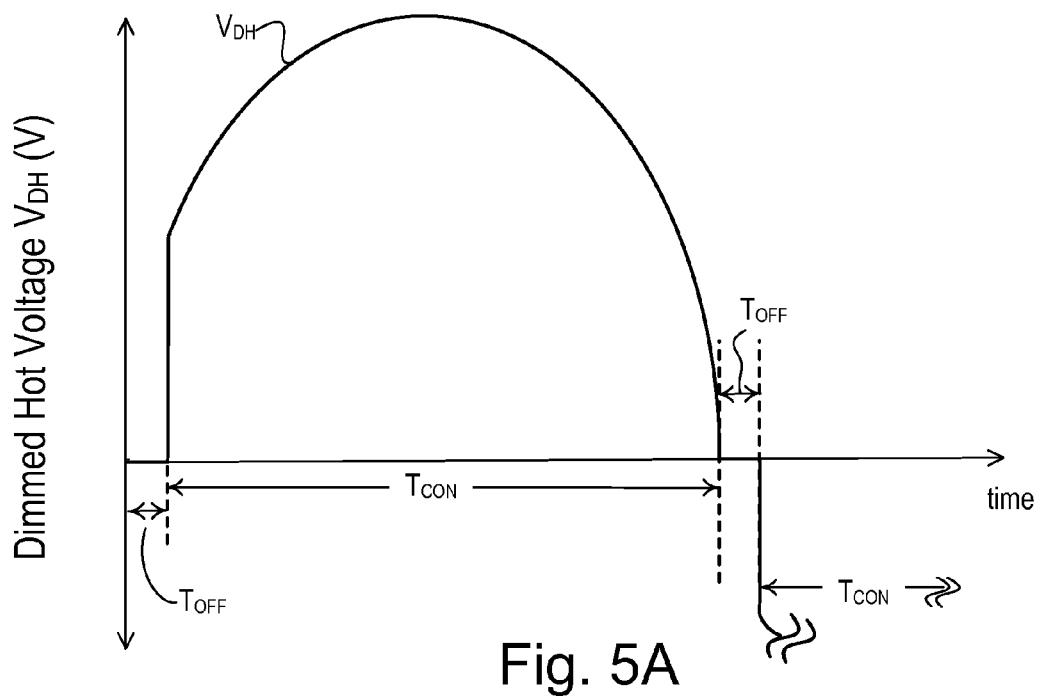
FIG. 5A and FIG. 5B are an example voltage waveforms illustrating forward-phase control dimming on an inductive load during a normal operation condition.
Figure 5B:
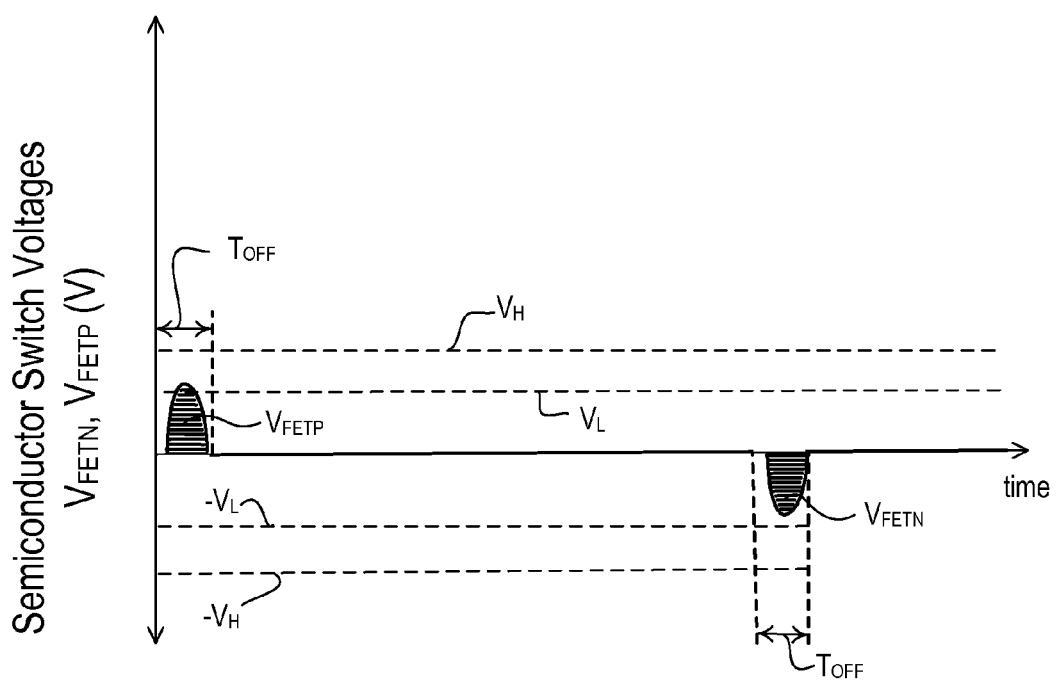

FIG. 5A and FIG. 5B show example voltage waveforms illustrating forward-phase control dimming provided by the load control device 100 during a normal operating condition when the load control device 100 is controlling the load to an on state near a maximum light intensity level. As mentioned above, during forward-phase control dimming, the FETs 126A, 126B are rendered non-conductive at the beginning of each half cycle and are rendered conductive at the end of each half cycle as shown in FIG. 5A. In this example, the lighting load 104 is highly inductive, which is a typical operating characteristic of magnetic low voltage transformers. The inductive nature of the lighting load 104 can cause a phase shift between the dimmed hot voltage $V_{DH}$ and a dimmed hot current (not shown). As a result of this phase shift and as a result of the operation of the FETs 126A, 126B as discussed above, the amount of voltage across the FETs detected by the voltage monitor circuit 130 may be very small.

Similar to FIG. 4B, both the negative and positive voltages $V_{FETN}$, $V_{FETP}$ of FIG. 5B are near the low threshold voltage $V_L$. In particular, the negative voltage $V_{FETN}$ across FET 126B is slightly below the low threshold voltage $V_L$, and the positive voltage $V_{FETP}$ across FET 126A is slightly above the low threshold voltage. However, as discussed above, because the voltage $V_{FETP}$ across FET 126A in the positive half cycle is less than the high threshold voltage $V_H$, the microprocessor will correctly determine that both FETs are operating properly while using the forward-phase control dimming technique despite the inductive characteristic of the lighting load 104.

In addition, other types of load conditions could cause the positive and negative voltages $V_{FETP}$ and $V_{FETN}$ measured across the FETs 126A, 126B to be near the low threshold voltage $V_L$. For example, if the load control device 100 is unloaded (e.g., not coupled to a load), the voltage detected across each FET could be near the low threshold voltage $V_L$ even though the FETs are operating properly. Thus, the low measured voltages would not be indicative of a shorted FET condition in this case. Also, the AC line voltage can be subject to various kinds of line distortion which can cause the voltages $V_{FETN}$ and $V_{FETP}$ to be near the low threshold voltage without being indicative of a shorted FET condition.

FIG. 6 shows a simplified flowchart of a shorted FET (fault) detection procedure 300 that is executed by the microprocessor 114 periodically. The procedure 300 is entered at step 305 which may occur shortly after the zero-crossing detector 120 detects a zero-crossing. Next, at step 400A, a FET sample procedure 400 is executed for $FET_A$ (e.g., FET 126A). $FET_A$ is representative of the FET which is actively rendered conductive during the first half cycle after the zero crossing. For example, if the zero-crossing indicates a transition of the line voltage from negative polarity to positive polarity, then $FET_A$ will be the active FET during the positive half cycle, and thus, the sampling procedure 400 will monitor $V_{FETP}$ throughout the positive half cycle. At step 500A, an update FET counter procedure 500 is executed for $FET_A$. The FET counters are used to track the results of the sampling procedure 400 over multiple line cycles. Then, the counters of $FET_A$ are processed and evaluated during an evaluate procedure 600A. During steps 400B, 500B, and 600B, the FET that is active during the following half cycle (i.e., $FET_B$) is then sampled, its counters updated and evaluated in a similar fashion as $FET_A$ before exiting the procedure 300 at step 315.

Figure 7:
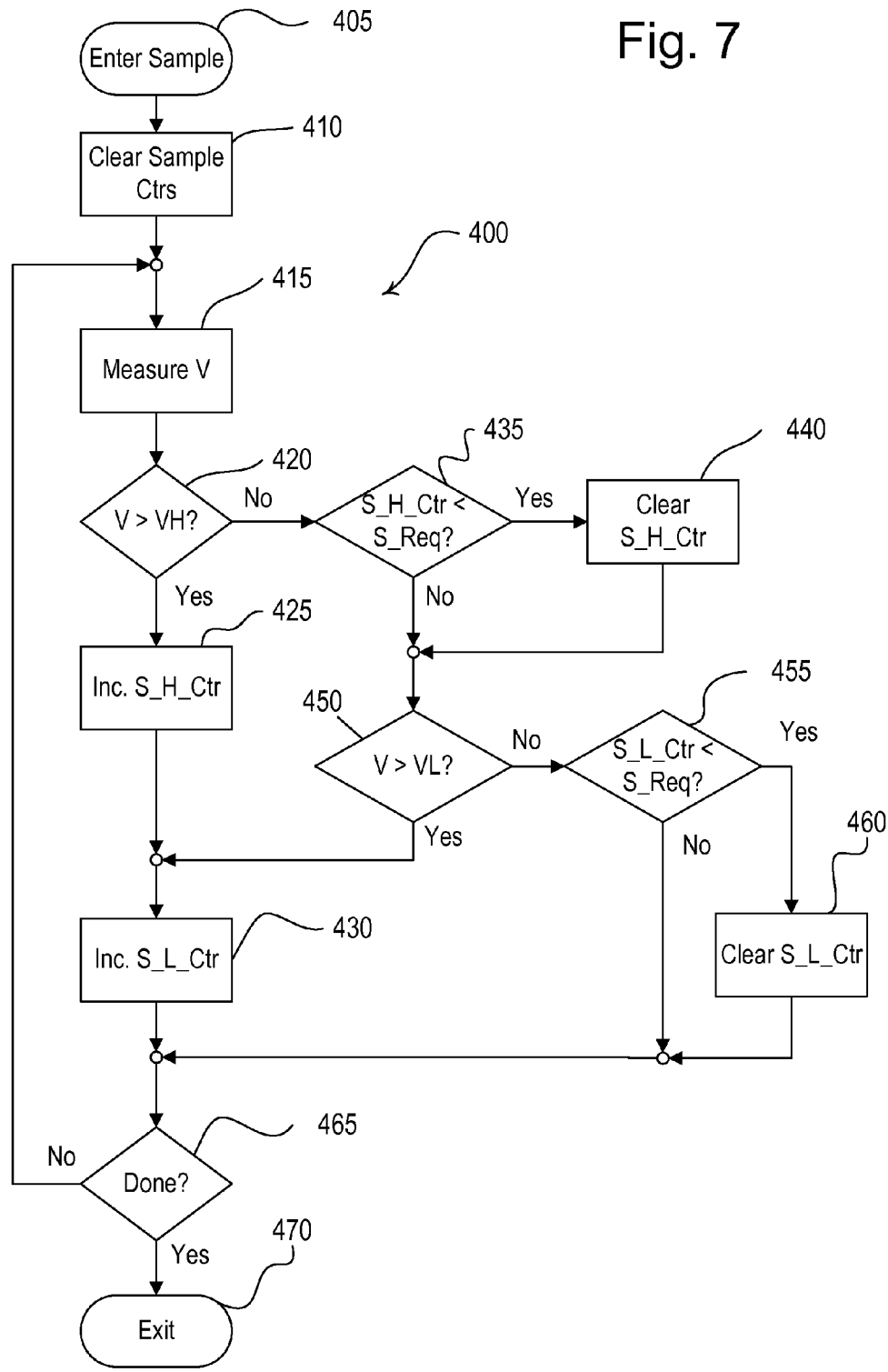
FIG. 7 is a simplified flowchart of a sampling procedure according to the present invention.

FIG. 7 shows a simplified flowchart of the sampling procedure 400, which is executed at step 400A for $FET_A$ and at step 400B for $FET_B$ of the shorted FET detection procedure 300. The sampling procedure 400 provides for the microprocessor 114 to take multiple measured samples of the voltage signal from the voltage monitor circuit 130. At step 405, the sampling procedure is entered, and then at step 410, the microprocessor clears two variables used as sample counters, S_H_Ctr and S_L_Ctr. The sample high counter S_H_Ctr is used to track the number of measured samples which exceed the high threshold voltage $V_H$, and the sample low counter S_L_Ctr is used to track the number of measured samples which exceed the low threshold voltage $V_L$. The sampling process 400 for $FET_A$ and $FET_B$ is essentially the same, however a different set of sampling variables may be used for each FET (e.g., S_H_Ctr$_A$, S_L_Ctr$_A$ for $FET_A$ and S_H_Ctr$_B$, S_L_Ctr$_B$ for $FET_B$). The sampling procedure 400 uses the sample counters to determine whether a predetermined number of required samples (S_Req) exceed a given threshold voltage as will be discussed further below.

At step 415, the microprocessor 114 receives and measures the voltage signal from the voltage monitor circuit 130 which is representative of the voltage $V_{FETN}$ or $V_{FETP}$ depending on the present half cycle. Preferably, the microprocessor 114 includes an internal analog-to-digital (A-to-D) converter, and the voltage signal is received by the microprocessor via an A-to-D input port, such that the microprocessor can receive the analog voltage signal and convert it to a digital value in order to easily measure the magnitude of the voltage signal. If the measured voltage is greater than the high threshold voltage $V_H$ at step 420, the microprocessor 114 increments the sample high counter S_H_Ctr at step 425. Since the measured voltage is greater than the high threshold $V_H$, the measured voltage must also be greater than the low threshold $V_L$, and so the microprocessor 114 also increments the sample low counter S_L_CTR at step 430.

If the measured voltage is not greater than the high threshold voltage $V_H$ at step 420, the high sample counter S_H_Ctr is compared to the predetermined number of required samples S_Req (e.g., 3) at step 435. The sampling procedure 400 requires that the predetermined number of samples consecutively exceed a given threshold voltage. If the sample high counter S_H_Ctr is less than the predetermined number of required samples S_Req, than the sample high counter S_H_Ctr is cleared at step 440. In other words, because the most recent voltage sample was less than the high threshold voltage at step 420, and because the predetermined number of required samples S_Req exceeding the high threshold voltage $V_H$ has not yet been detected at step 435, the S_H_Ctr must be cleared because the required number of consecutive measurements has not yet been received. If the sample high counter S_H_Ctr is not less than the required number of samples at step 435, the value of the counter is left unchanged.

Next, the measured voltage is compared to the low threshold voltage $V_L$ at step 450. If the measured voltage is greater than the low threshold voltage $V_L$, then the sample low counter S_L_Ctr is incremented at step 430. Otherwise, the sample low counter S_L_Ctr is then compared to the predetermined number of required samples S_Req at step 455. Maintaining the sample low counter S_L_Ctr in a similar manner as the sample high counter S_H_Ctr, if the sample low counter S_L_Ctr is less than the required number of consecutive samples, then the sample low counter S_L_Ctr is cleared at step 460. Otherwise, the sample low counter S_L_Ctr is left unchanged. After steps 430, 455, or 460, the microprocessor 114 checks as to whether the procedure 400 is complete at step 465. If it is not complete, then the sample procedure 400 continues sampling from step 415. Typically, the sampling procedure 400 will be completed when the present half cycle ends at which point the procedure exits at step 470.

Figure 8:
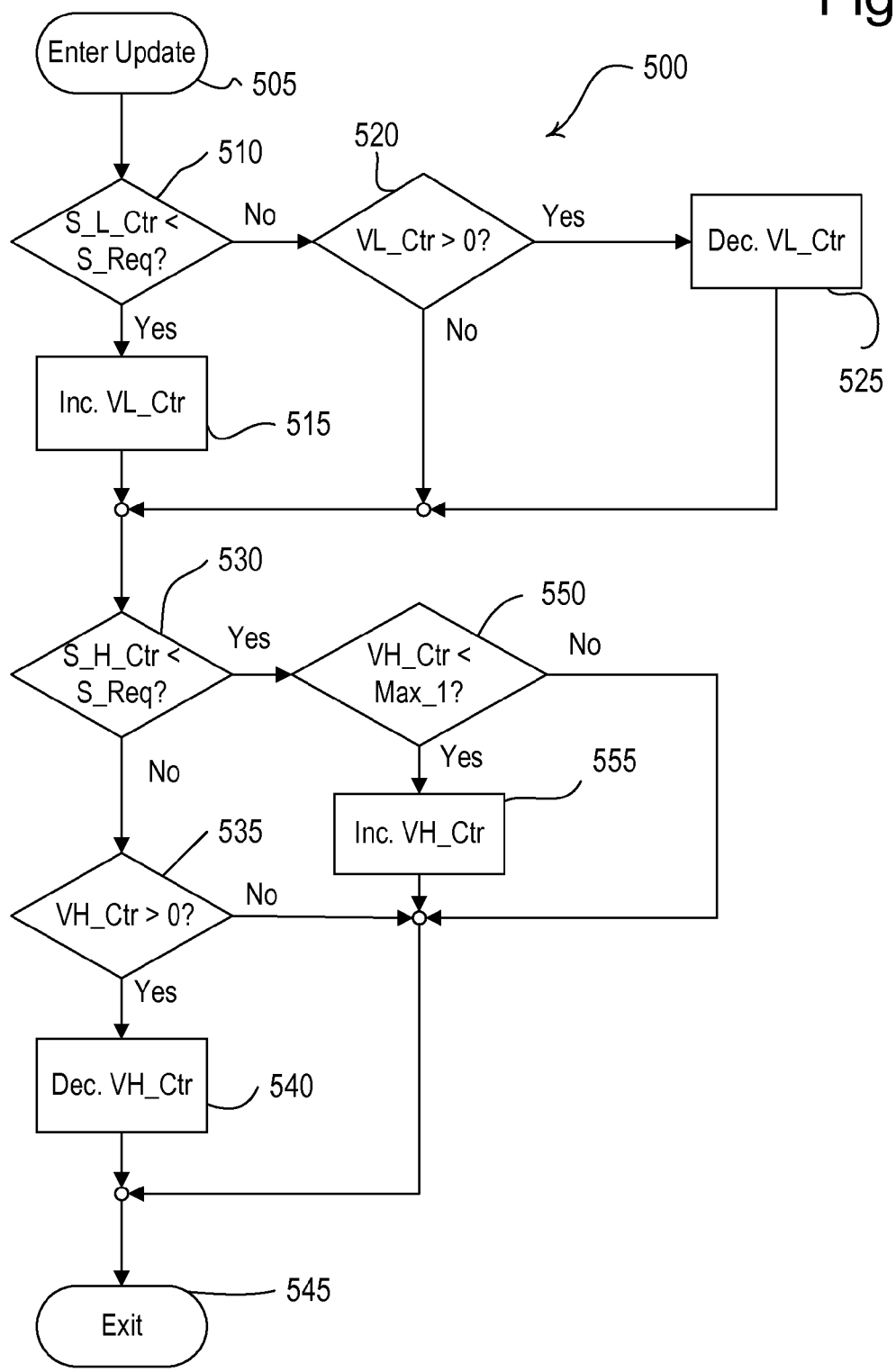
FIG. 8 is a simplified flowchart of a counter update procedure according to the present invention.

FIG. 8 shows a simplified flowchart of the update counter procedure 500 which is executed at step 500A for $FET_A$ and at step 500B for $FET_B$ of the shorted FET detection procedure 300. The update counter procedure 500 uses the sample high and low counters S_H_Ctr, S_L_Ctr to update two other variables, a voltage low counter VL_Ctr and a voltage high counter VH_Ctr. The update counter processes 500 for $FET_A$ and for $FET_B$ are essentially the same. However, the separate counter variables will be maintained for each FET (i.e., VH_Ctr$_A$, VL_Ctr$_A$ for $FET_A$ and VH_Ctr$_B$, VL_Ctr$_B$ for $FET_B$).

Generally, the voltage counters track the number of line cycles that the sampled voltage exceeds (or does not exceed) a given voltage threshold. More particularly, the voltage low counter VL_Ctr counts the number of half cycles when the sampled voltage does not exceed the low threshold voltage (i.e., the VL_Ctr is incremented once for each line cycle when the voltage samples do not exceed the low threshold voltage $V_L$, and it is decremented when the voltage samples do exceed the low threshold voltage $V_L$). Thus, in the event that there is a shorted FET, the VL_Ctr will be incremented each line cycle because the sampled voltages will not exceed the low threshold voltage $V_L$. The voltage high counter VH_Ctr counts the number of half cycles when the sampled voltage does not exceed the high threshold voltage $V_H$ (i.e., the VH_Ctr is incremented when the voltage samples do not exceed the high threshold voltage, and it is decremented once for each line cycle when the voltage samples do exceed the high threshold voltage). There are additional conditions that cause the voltage high counter VH_Ctr to be decremented which will be discussed further below.

The update counter procedure 500 is entered by the microprocessor 114 at step 505, and the microprocessor compares the sample low counter S_L_Ctr to the predetermined number of required samples at step 510. If the sample low counter is less than the required number of samples (i.e., the measured voltage across the FET did not consistently exceed the low threshold voltage $V_L$), then the microprocessor 114 increments the low voltage counter VL_Ctr at step 515. If the sample low counter S_L_Ctr is greater than or equal to the number of required samples S_Req, then at step 520, the microprocessor 114 compares the value of the low voltage counter VL_Ctr to zero. If the low voltage counter VL_Ctr is greater than zero, the counter is decremented at step 525. Otherwise, the low voltage counter VL_Ctr is left unchanged.

At step 530, the microprocessor 114 compares the sample high counter S_H_Ctr to the predetermined number of required samples S_Req. If the sample high counter is not less than the predetermined number of required samples S_Req (i.e., the measured voltage across the FET did consistently exceed the high threshold voltage $V_H$), then the microprocessor 114 compares the value of the high voltage counter VH_Ctr to zero at step 535. If the high voltage counter VH_Ctr is greater than zero, the counter is decremented at step 540. Otherwise, the high voltage VH_Ctr is left unaltered, and the process exits at step 545.

If at step 530, the sample high counter S_H_Ctr is less than the predetermined number of required samples S_Req (i.e., the measured voltage across the FET did not consistently exceed the high threshold voltage $V_H$), then at step 550 the high voltage counter VH_Ctr is compared to a first maximum number Max_1 which represents a first maximum number of line cycles in which the sampled voltage did not exceed the high threshold voltage. The first maximum number may have different values depending on the state of the load. For example, if the load is on, the value of the first maximum number may be 10, and if the load is off, the value of the first maximum number may be 4. If the high voltage counter VH_Ctr is less than the first maximum value Max_1, than the high voltage counter VH_Ctr is incremented at step 555, and the procedure 500 exits at step 545. If the high voltage counter VH_Ctr is already greater than or equal to the first maximum number Max_1, then the procedure exits at step 545 without altering the high voltage counter VH_Ctr.

Figure 9A:
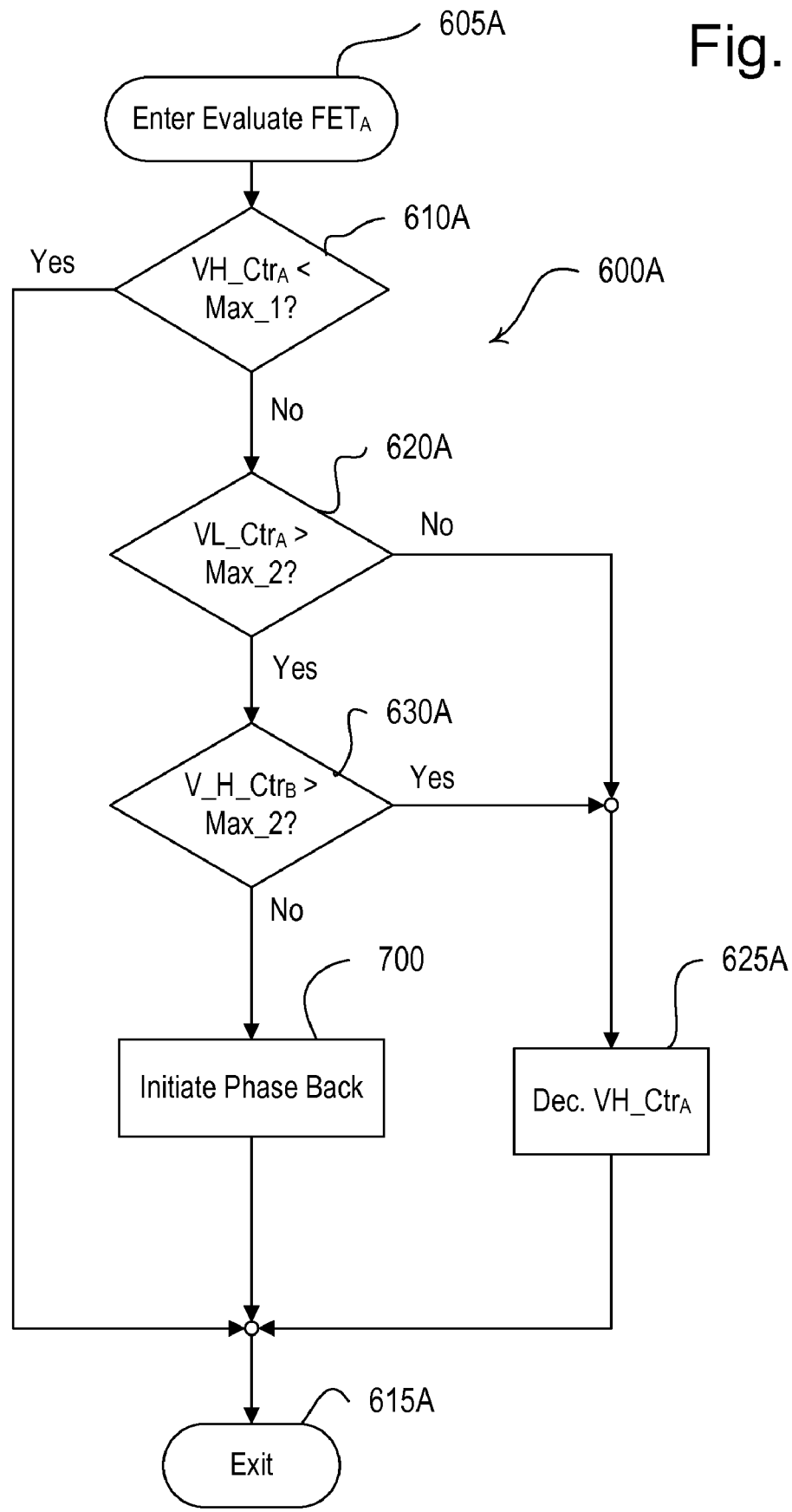
FIGS. 9A and 9B are simplified flowcharts of an evaluation procedure according to the present invention.

FIG. 9A shows a simplified flowchart of the counter evaluation procedure 600A for $FET_A$. In order for the microprocessor 114 to determine that a FET is possibly shorted, the measured voltage across the FET must be below the high threshold voltage for at least the first maximum number (Max_1) of line cycles. In addition, the measured voltage across the FET must be below the low threshold voltage for a second maximum number (Max_2) of line cycles. Typically, the value of the second maximum number is half of the value of the first maximum number (e.g., 5 and 2 for the on and off states, respectively). Finally, the measured voltage across the other FET must be above the high threshold voltage for at least the second maximum number of line cycles. In other words, the voltage measured across $FET_A$ must be below the low threshold voltage for a given number of line cycles and the voltage measured across $FET_B$ must be above the high threshold voltage for at least the same number of line cycles in order for the microprocessor 114 to determine that $FET_A$ is possibly shorted according to the counter evaluation procedure 600A.

At step 605A, the counter evaluation procedure 600A is entered by the microprocessor 114. At step 610A, the high voltage counter for $FET_A$ (VH_Ctr$_A$) is compared to the first maximum value Max_1 of line cycles. If the high voltage counter for $FET_A$, VH_Ctr$_A$, is less than the first maximum value Max_1 (i.e., the voltage sampled across $FET_A$ has not been less than the high threshold voltage $V_H$ for the predetermined number of line cycles), then the procedure 600A exits at step 615A because the value of the counter does not indicate that $FET_A$ is shorted. Otherwise, the procedure continues to step 620A where the low voltage counter for $FET_A$ (VL_Ctr$_A$) is compared to the second maximum number Max_2.

If at step 620A, the $FET_A$ low voltage counter VL_Ctr$_A$ is not greater than the second maximum value Max_2 (i.e., the voltage sampled across $FET_A$ has not been less than the low threshold voltage for a second given number of line cycles), then at step 625A, the microprocessor decrements the high voltage counter for $FET_A$. Because the high voltage counter for $FET_A$ has reached the first maximum number, but the low voltage counter for $FET_A$ has not reached the second maximum number, the microprocessor 114 will determine that $FET_A$ does not yet appear to be shorted. Thus, the high voltage counter VH_Ctr$_A$ need not remain at the first maximum number, and so it is decremented at step 625A before the procedure exits at step 615A.

If at step 620A, the $FET_A$ low voltage counter VL_Ctr$_A$ is greater than the second maximum value Max_2 (i.e., the voltage sampled across $FET_A$ has been less than the low threshold voltage for the second maximum number of line cycles), then the microprocessor 114 checks the high voltage counter for $FET_B$ (VH_Ctr$_B$) at step 630A to determine whether the voltage across $FET_B$ has been greater than the high threshold voltage for the second given number of line cycles. If the high voltage counter for $FET_B$ is greater than the second maximum number Max_2 (i.e., the voltage sampled across $FET_B$ has not been greater than the high threshold voltage for the second maximum number of half cycles), then at step 625A, the microprocessor decrements the high voltage counter for $FET_A$. Because the low voltage counter for $FET_A$ has reached the second maximum number, but the high voltage counter for $FET_B$ indicates the voltage across $FET_B$ has not been exceeding the high threshold voltage, the microprocessor 114 will determine that $FET_A$ does not yet appear to be shorted. Rather, the microprocessor 114 determines that the voltages across each FET are rather low as indicated in FIG. 4B. Again, because the high voltage counter for $FET_A$ has reached the first maximum number as determined at step 610A, $FET_A$ does not yet appear to be shorted and the high voltage counter for $FET_A$ need not remain at the first maximum number. As a result, it is decremented at step 625A before the procedure exits at step 615A.

Figure 9B:
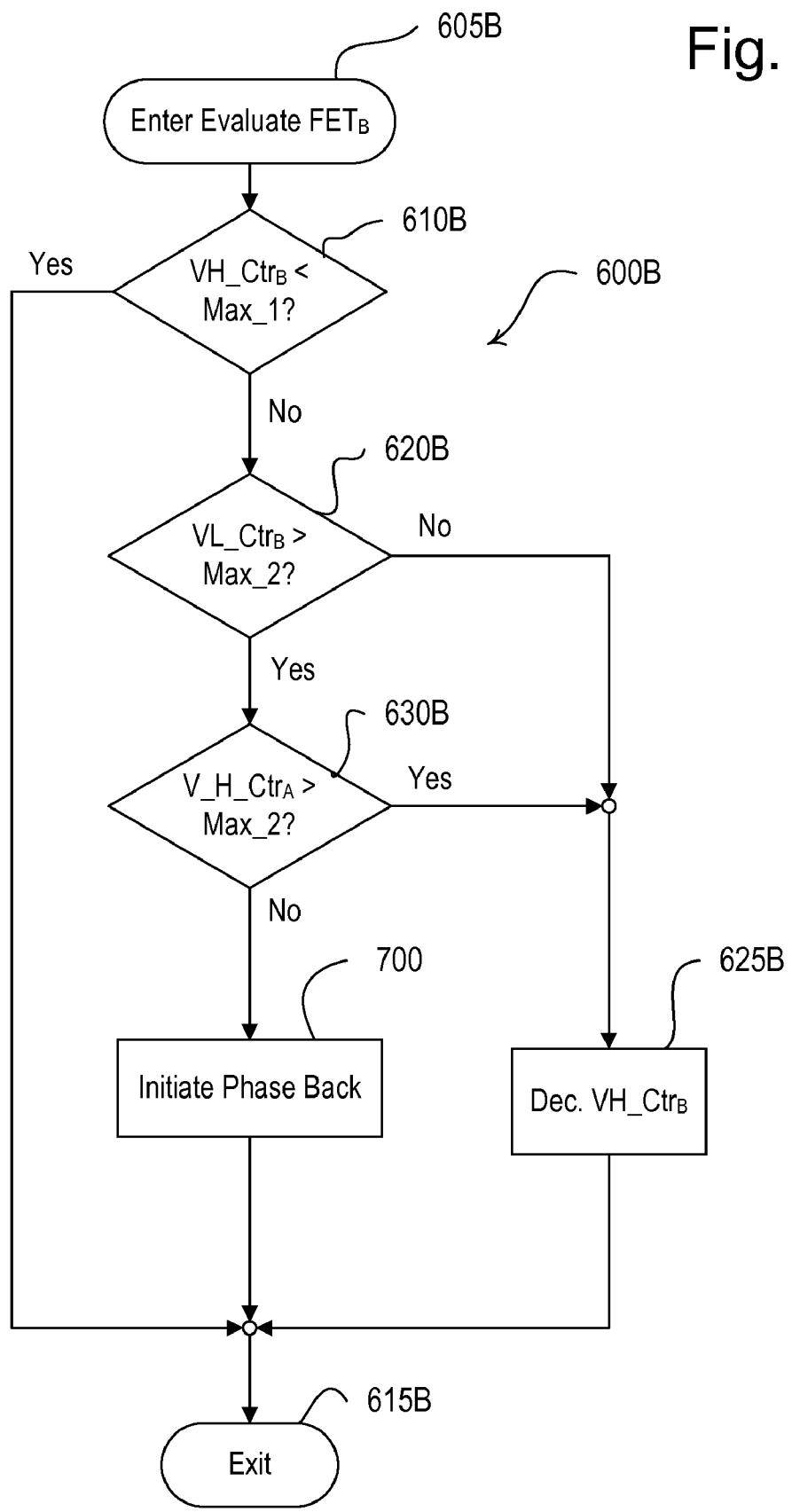

If at step 630A, the high voltage counter for $FET_B$ is not greater than the second maximum number Max_2 (i.e., the voltage sampled across $FET_B$ has been greater than the high threshold voltage for a given number of half cycles), then the microprocessor 114 determines that $FET_A$ may be shorted and initiates a phase back procedure at step 700 before exiting at step 615A. FIG. 9B shows a simplified flowchart of the counter evaluation procedure 600B which operates in a similar fashion as the counter evaluation procedure 600A for $FET_A$, however, the counter values of $FET_B$ are evaluated to determine whether $FET_B$ could possibly be shorted.

Figure 10:
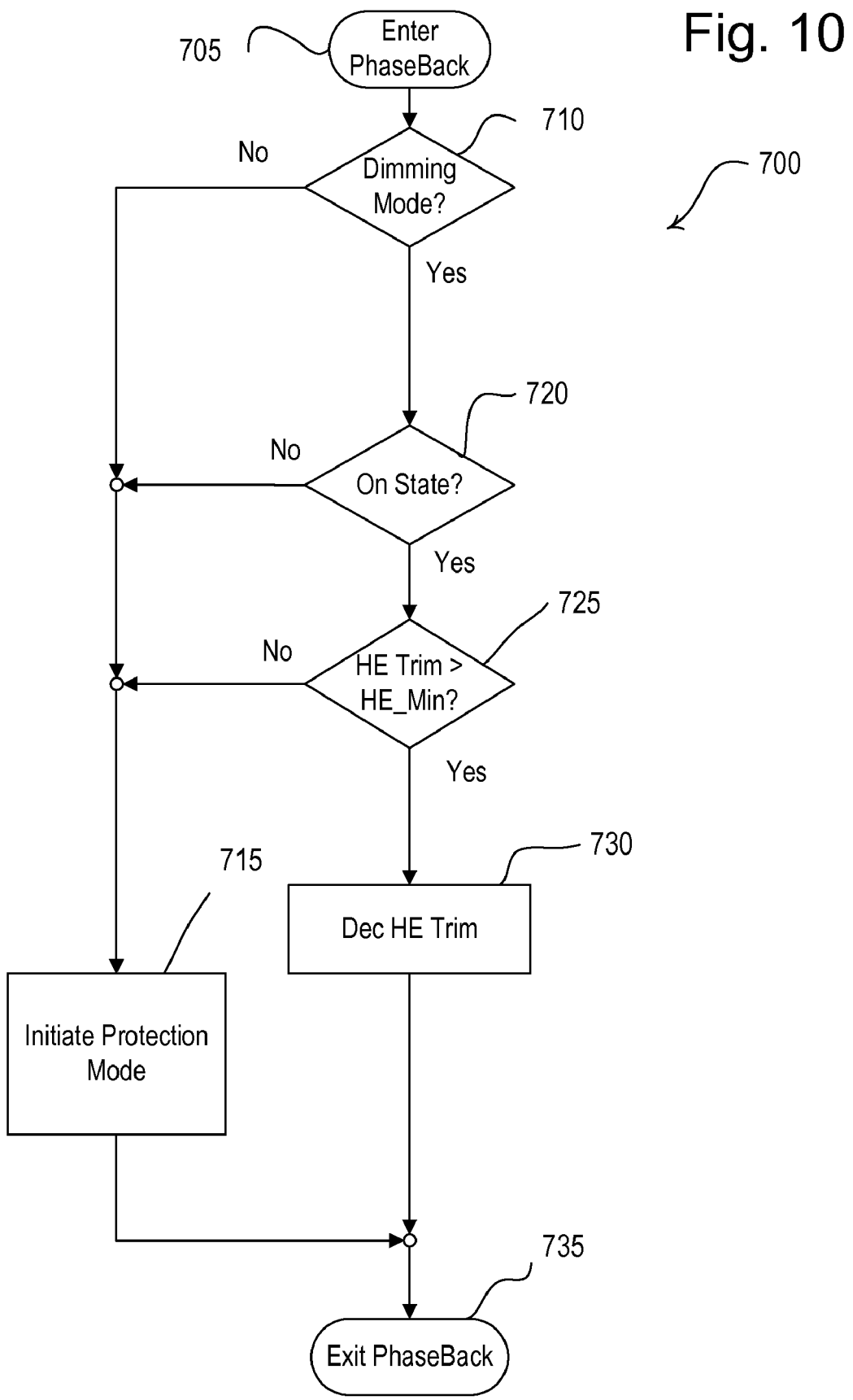
FIG. 10 is a simplified flowchart of a phase back procedure according to the present invention.

FIG. 10 shows a simplified flowchart of the phase back procedure 700. According to another aspect of the invention, upon detecting the voltage conditions across each semiconductor switch that are indicative of a fault condition, the load control device 100 is operable to initiate the phase back procedure 700 to reduce the maximum light intensity (i.e., high end (HE) trim) and the FET detection procedure 300 is operable to continue to monitor the voltage across the semiconductor switches. In some cases, reducing the high end trim provides time for more voltage to develop across each semiconductor switch in the event that the semiconductor switch is not actually shorted. When the high end trim is reduced, the off time of the semiconductor switches is increased. For example, referring back to the voltage waveforms of FIGS. 4A and 4B, by increasing the off time $T_{OFF}$ of the semiconductor switches, the voltages across the semiconductor switches are given more time to develop, and as a result, the measured voltages may no longer be indicative of a fault condition (e.g., the voltage $V_{FETN}$ may increase above the low threshold voltage). However, when the semiconductor switch is actually shorted, the phase back procedure 700 will have no effect on the voltage measured across the shorted semiconductor switch, and as a result, the load control device 100 will initiate the protection mode.

The phase back procedure 700 is entered by the microprocessor 114 at step 705, and at step 710, the microprocessor confirms whether it is operating in a dimming mode. The load control device 100 is operable to control the load 104 in the dimming mode or a switching mode depending upon the load type or the preference of an end-user. If the load control device 100 is operating in switching mode (i.e., not dimming mode), the high end trim should not be adjusted, thus protection mode is initiated at step 715. Protection mode is defined as driving both semiconductor switches to full conduction, so when one of the FETs is shorted and can no longer be controlled, the other FET can be driven fully conductive so as to avoid an asymmetry condition as discussed above.

If the load control device 100 is operating in dimming mode, then the microprocessor 114 determines whether the load control device 100 is in the on state or the off state at step 720. If it is in the off state, then the protection mode is initiated at step 715. During the off state, the off time of each FET cannot possibly be increased any further, so reducing the high end trim is unnecessary in this case. More importantly, because the magnitudes of the threshold voltages $V_H$ and $V_L$ used in the off state are greater than the magnitudes of $V_H$ and $V_L$ used in the on state, the likelihood of falsely detecting a shorted FET condition in the off state is dramatically reduced, and so the protection mode can be initiated immediately.

If the load control device is in the on state at step 720, the microprocessor 114 then compares the present high end trim to a minimum high end trim value (e.g., 80%). If the present high end trim is not greater than the minimum high end trim value, then the microprocessor 114 initiates protection mode at step 715. Otherwise, the high end trim is decremented by approximately 1% at step 730, and the phase back procedure 700 is exited at step 735. The shorted FET detection procedure 300 continues to operate periodically with the reduced high end trim. If a shorted FET is not detected during detection procedure 300, then the microprocessor 114 will continue to operate at the present adjusted high end trim until the load control device 100 is turned off. Once the load is turned off, the high end trim value is restored to a maximum default value in the event that the high end trim had been unnecessarily reduced during the phase back procedure 700 as a result of transient line conditions or normal loading conditions. Thus, the maximum high end trim may still be recovered.

If a shorted FET is still detected during procedure 300, the phase back procedure 700 is entered again at step 705. During the phase back procedure 700, either the high end trim will again be reduced by approximately 1% or if the high end trim has reached the minimum high end trim value, then protection mode will be initiated at step 715 and the procedure 700 will exit at step 735. Typically, the load control device 100 will continue to operate in protection mode until the power provided to the load control device is cycled and the microprocessor 114 is reset. Upon power up, the load control device 100 then executes the shorted FET detection procedure 300 again to determine whether an asymmetry condition or a shorted FET condition exists.

According to another embodiment of the present invention, an alternate shorted FET detection procedure could be used in conjunction with the phase back procedure 700 described above. The alternate shorted FET detection procedure could use only a single threshold to detect an asymmetry or fault condition of a FET. The single threshold could have the same magnitude as the low threshold voltage (e.g., 7.5 V). In short, if the microprocessor 114 samples and tracks the voltage across one of the FETs, and determines that the voltage across that FET is consistently below the single threshold, the microprocessor 114 could initiate the phase back procedure 700. At this point, the microprocessor 114 can determine whether reducing the high end trim value provides for more voltage to develop across the FET. Again, once the high end trim value is reduced, if the voltage measured across the FET is no longer less than the single threshold voltage, the microprocessor 114 can correctly determine that the FET is not actually shorted. Otherwise, if gradually reducing the high end trim to the minimum high end trim value does not cause the microprocessor 114 to detect voltages across the FET to be above the single threshold, then the microprocessor will conclude that the FET is shorted and will initiate the protection mode.

According to an alternative embodiment of the present invention, the evaluate procedure 600A and 600B could immediately initiate the protection mode (as opposed to the phase back procedure 700) upon making the determination that the FET may be shorted at step 630A or 630B.

According to yet another alternate embodiment of the present invention, the microprocessor 114 could use a single threshold voltage to detect a fault condition. The microprocessor 114 could measure a first voltage across the first semiconductor switch and compare that voltage to the single threshold voltage (e.g., $V_L$). Then, the microprocessor 114 could measure a second voltage across the second semiconductor switch, and calculate the difference between the first and second voltages. Next, the microprocessor 114 could compare the calculated difference to a predetermined offset voltage (e.g., 4.5 V). If the first voltage is less than the single threshold voltage, and the calculated difference between the first and second voltages is greater than the predetermined offset threshold, then the microprocessor would determine that an asymmetry condition or a fault condition of one of the semiconductor switches is present.

According to yet another alternate embodiment of the present invention, the microprocessor 114 could use only the offset threshold voltage to detect an asymmetry condition. The microprocessor 114 could measure a first voltage across the first semiconductor switch. Then, the microprocessor 114 could measure a second voltage across the second semiconductor switch, and calculate the difference between the first and second voltages. Next, the microprocessor 114 could compare the calculated difference to the predetermined offset voltage (e.g., 4.5 V). If the calculated difference between the first and second voltages is greater than the predetermined offset threshold, then the microprocessor would determine that an asymmetry condition is present.

Figure 11:
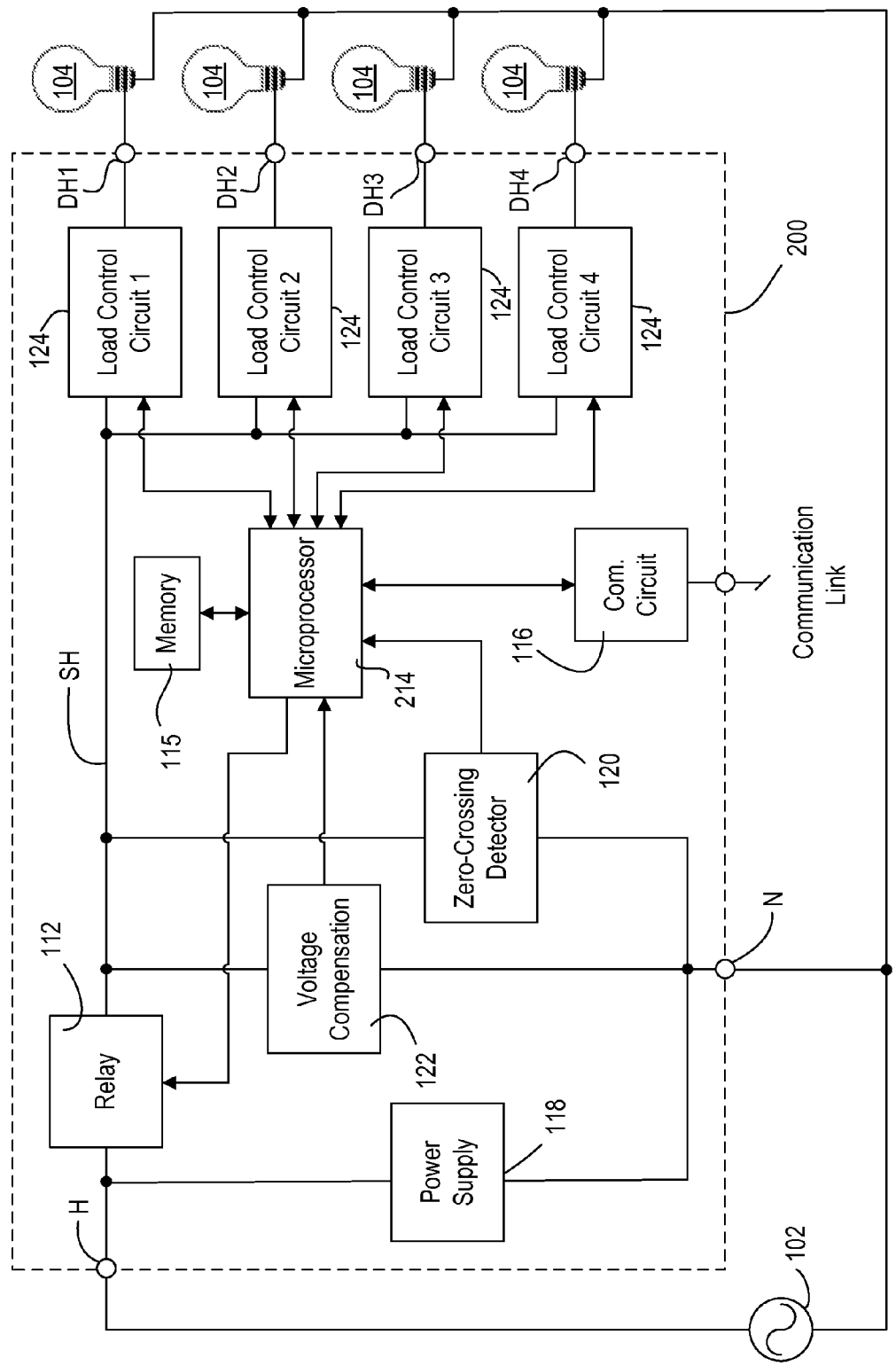
FIG. 11 is a simplified block diagram of a load control device according to an alternate embodiment of the present invention.

FIG. 11 is a simplified block diagram of a load control device 200 according to another alternate embodiment of the present invention. The load control device 200 comprises four load control circuits 124 to individually control four separate lighting loads 104 via four dimmed hot terminals DH1, DH2, DH3, DH4. A microprocessor 214 is operable to control each load control circuit 124 in the same manner as microprocessor 114 of the first embodiment, and the microprocessor 214 also receives inputs from the voltage monitoring circuit 130 within each load control circuit. All other functional blocks of load control device 200 are essentially the same as the load control device 100 of the first embodiment.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of detecting a fault condition of a first semiconductor switch in a load control device operable to be electrically coupled between an alternating-current (AC) power source and a load for control of the load to an on state or an off state, the first semiconductor switch coupled in anti-series connection with a second semiconductor switch, the method comprising the steps of:
measuring a first voltage across the first semiconductor switch during a first half cycle of the AC power source;
comparing the first measured voltage to a first voltage threshold and a second voltage threshold greater than the first voltage threshold;
measuring a second voltage across the second semiconductor switch during a second half cycle of the AC power source;
comparing the second measured voltage to the first and second voltage thresholds; and
detecting the fault condition of the first semiconductor switch if the first measured voltage is less than the first voltage threshold and the second measured voltage is greater than the second voltage threshold.

2. The method of claim 1, wherein the first and second semiconductor switches comprise first and second field effect transistors, respectively.

3. The method of claim 2, wherein the fault condition comprises an electrical shorted state of the first field effect transistor.

4. The method of claim 1, further comprising the step of:
initiating a protection mode upon detecting the fault condition, wherein the protection mode comprises rendering the second semiconductor switch fully conductive.

5. The method of claim 1, wherein the first and second semiconductor switches are operable to be rendered conductive for a first period of time when the load is in the on state and further comprising the step of:
initiating a phase back mode upon detecting the fault condition, wherein the phase back mode comprises rendering the first and second semiconductor switches conductive for a second period of time, less than the first period of time.

6. The method of claim 1, wherein the step of measuring the first and second voltages further comprises taking multiple samples of the first and second voltages.

7. The method of claim 1, further comprising the steps of:
counting a first number of half cycles in which the first measured voltage is less than the first predetermined voltage threshold and a second number of half cycles in which the second measured voltage is greater than the second predetermined voltage threshold; and
comparing the first number of half cycles to a first predetermined maximum number and comparing the second number of half cycles to a second predetermined maximum number.

8. The method of claim 7, wherein:
if the state of the load is on, the first predetermined maximum number has a first value and the second predetermined maximum number has a second value; and
if the state of the load is off, the first predetermined maximum number has a third value less than the first value and the second predetermined maximum number has a fourth value less than the second value.

9. The method of claim 1, wherein the first voltage threshold has a first magnitude and the second voltage threshold has a second magnitude, and the first magnitude is approximately 7.5 volts and the second magnitude is approximately 12 volts.

10. The method of claim 1, wherein:
if the state of the load is on, the first voltage threshold has a first magnitude and the second voltage threshold has a second magnitude; and
if the state of the load is off, the first voltage threshold has a third magnitude greater than the first magnitude and the second voltage threshold has a fourth magnitude greater than the second magnitude.

11. The method of claim 10, wherein the first magnitude is approximately 7.5 volts and the second magnitude is approximately 12 volts.

12. The method of claim 11, wherein the third magnitude is approximately 20 volts and the fourth magnitude is approximately 47 volts.

13. A method of detecting an asymmetry condition in a bidirectional semiconductor switch of a load control device, the load control device operable to be electrically coupled between an alternating-current (AC) power source and a load, the bidirectional semiconductor switch comprising first and second semiconductor switches coupled in anti-series connection, the method comprising the steps of:
measuring a first voltage across the first semiconductor switch during a first half cycle of the AC power source;
measuring a second voltage across the second semiconductor switch during a second half cycle of the AC power source; and
detecting the asymmetry condition in the bidirectional semiconductor switch if a difference between the first and second measured voltages is greater than a predetermined offset threshold.

14. The method of claim 13, further comprising the steps of:
comparing the first measured voltage to a first predetermined voltage threshold; and
detecting the asymmetry condition in the bidirectional semiconductor switch if the first measured voltage is less than the first predetermined voltage threshold and the difference between the first and second measured voltages is greater than the predetermined offset threshold.

15. The method of claim 14, further comprising the steps of:
calculating the difference between the first and second measured voltages; and
comparing the difference between the first and second measured voltages to the predetermined offset threshold.

16. The method of claim 15, further comprising the steps of:
comparing the second measured voltage to a second predetermined voltage threshold, greater than the first predetermined voltage threshold and the offset threshold; and
detecting the asymmetry condition in the bidirectional semiconductor switch if the first measured voltage is less than the predetermined voltage threshold and the second measured voltages is greater than the second predetermined voltage threshold.

17. The method of claim 16, further comprising the step of:
initiating a protection mode upon detecting the asymmetry condition, wherein the protection mode comprises rendering the second semiconductor switch fully conductive.

18. The method of claim 13, wherein the first and second semiconductor switches comprise first and second field effect transistors, respectively.

19. The method of claim 13, wherein the step of measuring the first and second voltages further comprises taking multiple samples of the first and second voltages.

20. The method of claim 19, further comprising the steps of:
counting a first number of half cycles in which the first measured voltage is less than the predetermined voltage threshold and a second number of half cycles in which the difference between the first and second measured voltages is greater than the predetermined offset threshold; and comparing the first number of half cycles to a first predetermined maximum number and comparing the second number of half cycles to a second predetermined maximum number.

21. The method of claim 15, wherein the first predetermined voltage threshold has a first magnitude of approximately 7.5 volts.

22. The method of claim 13, wherein the predetermined offset threshold is at least 4.5 volts.

23. A method of detecting a fault condition in a load control device operable to be electrically coupled between an alternating current (AC) power source and a load, the method comprising the steps of:

rendering a first semiconductor switch non-conductive for a first predetermined period of time during a first line cycle of the AC power source;

measuring a first voltage across the first semiconductor switch during the first line cycle;

comparing the first measured voltage to a first predetermined voltage threshold;

if the first measured voltage is less than the first predetermined voltage threshold, rendering the first semiconductor switch non-conductive for a second period time, greater than the first period of time, during a second line cycle of the AC power source;

measuring a second voltage across the first semiconductor switch during the second line cycle;

comparing the second measured voltage to the first predetermined voltage threshold; and detecting the fault condition of the first semiconductor switch if the second measured voltage is less than the first predetermined voltage threshold.

24. The method of claim 23, wherein the first predetermined voltage threshold has a first magnitude of approximately 7.5 volts.

25. The method of claim 23, wherein the first semiconductor switch comprises a field effect transistor.

26. The method of claim 25, wherein the fault condition comprises an electrical shorted state of the field effect transistor.

27. The method of claim 23, further comprising the step of:

initiating a protection mode upon detecting the fault condition of the first semiconductor switch, wherein the protection mode comprises rendering a second semiconductor switch fully conductive.

28. The method of claim 23, further comprising the steps of:

rendering a second semiconductor switch non-conductive for the first predetermined period of time during a second half cycle of the first line cycle of the AC power source;

measuring a third voltage across the second semiconductor switch during the second half cycle of the first line cycle;

comparing the third measured voltage to the first predetermined voltage threshold;

if the first measured voltage across the first semiconductor switch is less than the first predetermined voltage threshold and the third measured voltage across the second semiconductor switch is greater than the first predetermined voltage threshold, rendering the first semiconductor and second semiconductor switches non-conductive for the second period time, greater than the first period of time, during the second line cycle of the AC power source;

measuring a fourth voltage across the second semiconductor switch during a second half cycle of the second line cycle of the AC power source;

comparing the fourth measured voltage to the first predetermined voltage threshold; and detecting the fault condition of the first semiconductor switch if the second measured voltage is less than the first predetermined voltage threshold and the fourth measured voltage is greater than the first predetermined voltage.

29. The method of claim 28, further comprising the step of:

initiating a protection mode upon detecting the fault condition of the first semiconductor switch, wherein the protection mode comprises rendering the second semiconductor switch fully conductive.

30. The method of claim 28, further comprising the steps of:

comparing the third measured voltage to a second predetermined voltage threshold, greater than the first predetermined voltage threshold;

if the third measured voltage is greater than the second predetermined voltage threshold, rendering the second semiconductor switch non-conductive for the second period time, greater than the first period of time, during a second half cycle of the second line cycle of the AC power source;

comparing the fourth measured voltage to the second predetermined voltage threshold, greater than the first predetermined voltage threshold; and detecting the fault condition of the first semiconductor switch if the second measured voltage is less than the first predetermined voltage threshold and the fourth measured voltage is greater than the second predetermined voltage.

31. The method of claim 30, wherein the first predetermined voltage threshold has a first magnitude of approximately 7.5 volts, and the second predetermined voltage threshold has a second magnitude of approximately 12 volts.

32. The method of claim 31, wherein the first and second semiconductor switches comprise first and second field effect transistors, respectively.

* * * * *